United States Patent [19]

Koyama

[11] Patent Number: 5,068,698
[45] Date of Patent: Nov. 26, 1991

[54] MOS SEMICONDUCTOR DEVICE HAVING HIGH-CAPACITY STACKED CAPACITOR

[75] Inventor: Kuniaki Koyama, Tokyo, Japan

[73] Assignee: NEC Corporation, Tokyo, Japan

[21] Appl. No.: 586,816

[22] Filed: Sep. 24, 1990

[30] Foreign Application Priority Data

Sep. 25, 1989 [JP] Japan .................................. 1-248533

[51] Int. Cl.$^5$ ..................... H01L 29/68; H01L 27/02; H01L 21/70
[52] U.S. Cl. .................................... 357/23.6; 357/51; 357/41; 437/52
[58] Field of Search .................... 357/23.6, 51; 437/52

[56] References Cited

FOREIGN PATENT DOCUMENTS 1-265556 10/1989 Japan ..................................... 437/52

OTHER PUBLICATIONS

"Session XVII: Megabit Drams", FAM 17.7: A 1Mb Dram with 3-Dimensional Stacked Capacitor Cells, Takemae, et al., 1985, IEEE International Solid State Circuits Conference, pp. 250-251, (1985).

Primary Examiner—Rolf Hille
Assistant Examiner—Robert P. Limanek
Attorney, Agent, or Firm—Burns, Doane, Swecker & Mathis

[57] ABSTRACT

A semiconductor memory device having a plurality of memory cells each comprising an insulated gate MOS transistor and a stacked capacitor. The stacked capacitor having a lower electrode and an oppositely disposed upper electrode whereby the lower electrode has an insulating film in its interior, thereby making it possible to increase the capacitance of the stacked capacitor without increasing the surface area of the electrode.

3 Claims, 4 Drawing Sheets

MOS SEMICONDUCTOR DEVICE HAVING HIGH-CAPACITY STACKED CAPACITOR

BACKGROUND OF THE INVENTION

The present invention relates to a MOS semiconductor device and more particularly to a dynamic random access memory (DRAM) having a memory cell composed of a stacked capacitor and an insulated gate MOS transistor.

A memory cell composed of a single MOS transistor and a stacked capacitor has been widely used to realize high integration in memory devices. Moreover, with further increase in the degree of integration of semiconductor devices, it is becoming increasingly difficult to secure the required capacity from the stacked capacitors. Thus, for augmenting the capacity an increase in the surface area of the capacitor electrode is required. However, an attempt to enlarge the surface area leads to an increase in the overall size of the memory cell, which is a completely unacceptable result.

A method for overcoming the above-mentioned drawback provides an increase in the surface area of the capacitor electrode involving an increase in the film thickness of the polycrystalline silicon layer which serves as the lower electrode. This conventional method possesses a significant shortcoming. Specifically, this conventional method of increasing the film thickness of the lower electrode involves the necessity of patterning the thick polycrystalline silicon layer. However, in this process, when polycrystalline silicon remains due to etching residue buried in the narrow portions between the gate electrodes in the underlying layers, short circuiting occurs which adversely affects the operation of the memory cell.

As the simplest way for overcoming such a drawback prolonged etching has been proposed. Such a measure often results in the problem of a reduced electrode area due to side etching of the lower electrode or a breaking of the step edge in the upper electrode, of the capacitor. Moreover, a prolonged etching of the polycrystalline silicon may in turn cause damage to the underlying insulating films which will contribute to the step height on the chip.

SUMMARY OF THE INVENTION

One object of the present invention is to provide a DRAM device which can realize a high integration density with an increased capacity stacked capacitor.

Another object of the present invention is to provide a method of thoroughly patterning the electrode forming material within a short period of time.

Accordingly, the semiconductor device according to the present invention includes a plurality of memory cells each composed of a stacked capacitor for storing information, and an insulated gate MOS transistor for selectively reading data from or writing data to the stacked capacitor and is featured in that the lower electrode of the stacked capacitor includes an insulating film enclosed in its interior.

According to a first embodiment of the present invention, the lower electrode of the capacitor is composed of a thin polycrystalline silicon layer which covers a PSG film. With such a construction the etching of the polycrystalline silicon layer does not require a long time and it also becomes possible to increase the surface area of the electrode without effecting the integration density of the semiconductor device.

Furthermore, according to a second embodiment of the present invention, an insulating film is provided on the chip in portions other than the capacitor portions, on the transistor, for example, which is employed in a peripheral circuit. This film is formed simultaneously with the PSG film within the lower electrode of the capacitor, and is used as a part of an interlayer insulating film. Consequently, in the memory cell constructed as above, it is possible to increase the thickness of the interlayer insulating film at required portions without involving an increase in the number of specialized process steps. This structure also achieves a reduction in the parasitic capacitance and a smoothing of the chip surface.

Therefore, as has been described in the above, the lower electrode of the stacked capacitor, which constitutes a memory cell of the present invention, is constructed in such a way as to enclose an insulating film within the electrode. In accordance with the present invention, it is possible to reduce the thickness of the lower electrode layer while maintaining the surface area of the lower electrode in the capacitor. Thus, it is possible to provide a necessary capacity to the capacitor and to thoroughly achieve the etching of the electrode forming material within a short period of time. Further, this method makes it possible to avoid the occurrence of the side etching of the electrode pattern and the roughness or the steps in the underlying layers which may be generated when a prolonged time is needed for the etching process.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
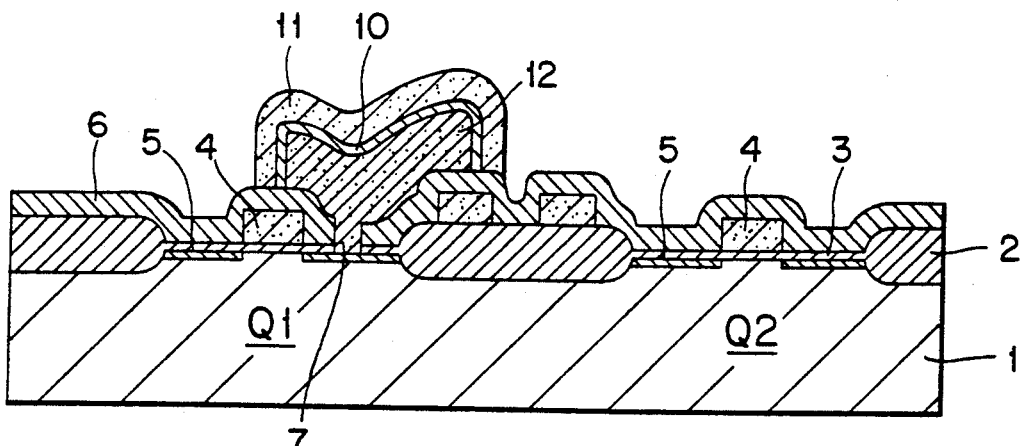
FIG. 1 is a cross-sectional view of a conventional semiconductor device.

In a conventional MOS semiconductor device, a stacked capacitor type memory cell is provided as shown in FIG. 1. More specifically, a MOS transistor Q1 constitutes a memory cell, and a MOS transistor Q2 constitutes a part of the peripheral circuit.

As shown, a field insulating film 2 and a gate insulating film 3 are formed on a P-type silicon substrate 1, polycrystalline silicon layers 4 which are used as the gate electrodes and the wiring layer for the transistors Q1 and Q2, are formed on the insulating films and further a CVD oxide film 6 is then formed on top. Moreover, on both sides of the polycrystalline silicon layers 4 that serve as the gate electrodes, there are formed source and drain diffusion layers 5 of the transistors Q1 and Q2 on the silicon substrate surface. A capacitor for storing information consists of a polycrystalline silicon layer 12 which is brought into contact with one of the source and drain diffusion layers of the transistor Q1 via an electrode window 7 formed in the CVD oxide film 6 and the gate oxide film 3. The capacitor further includes a silicon oxide film 10 which covers the surface of the polycrystalline silicon layer 12 and the polycrystalline layer 11 formed opposing the polycrystalline silicon layer 12 with the silicon oxide film 10 in-between.

However, with this conventional structure, the occupancy area of the memory cell has been gradually reduced with the increase in the degree of integration in semiconductor devices. Thus, it has become impossible to achieve the required capacity from the capacitor device of this structure.

Figure 2:
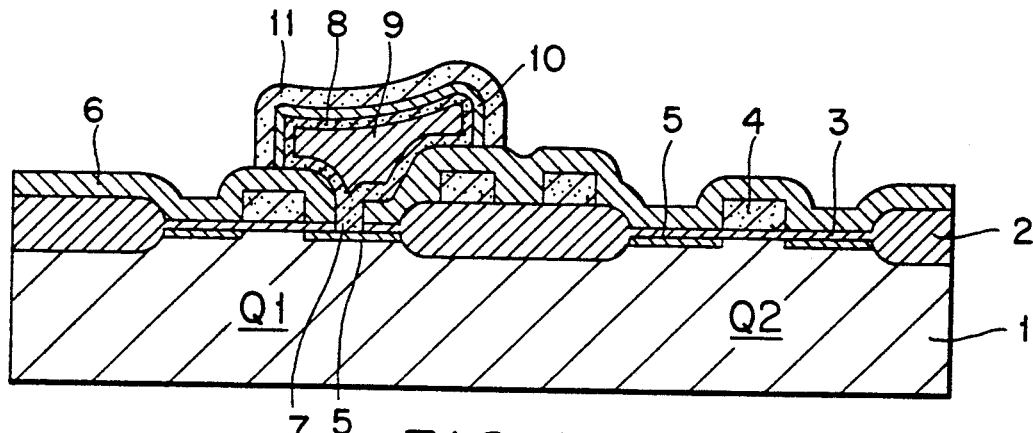
FIG. 2 is a cross-sectional view of a first embodiment of a memory cell according to the present invention.
Figure 4:
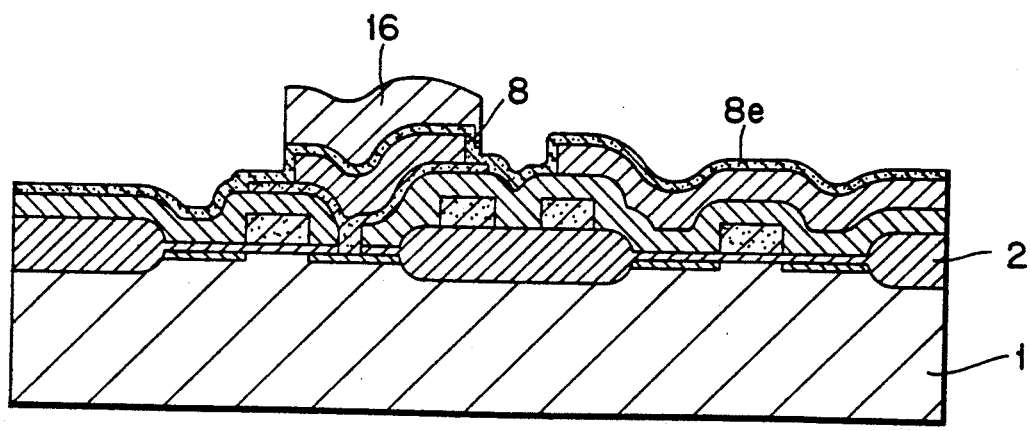
FIG. 4 is a cross-sectional view of a second embodiment of a memory cell.

Referring now to FIG. 2, in which like numerals denote like components shown in FIG. 1, a first embodiment of this invention will be explained.

According to the first embodiment, a memory cell transistor Q1 and a peripheral circuit transistor Q2 are formed on a P-type silicon substrate. As shown, a field insulating film 2, a gate insulating film 3 and polycrystalline silicon layer 4 are formed on the insulating films wherein the polycrystalline silicon layer 4 is used as the gate electrodes and the wiring layer for the transistors Q1 and Q2. Further, source and drain diffused regions 5 are formed on both sides of the gate electrodes 4 which are in turn covered by a CVD oxide layer 6. Next, an electrode window 7 is provided on one of the source and drain diffused layer 5 of transistor Q1. The stacked capacitor then formed includes a polycrystalline silicon layer 8 enclosing a PSG film 9 wherein said polycrystalline silicon layer is further covered with a silicon oxide film 10 and a polycrystalline silicon layer 11 respectively. In this embodiment the lower electrode of the capacitor consists of a thin polycrystalline silicon layer 8 which covers the PSG film 9 whereby this structure makes it possible to increase the surface area of the electrode.

Referring now to FIGS. 3(a) to 3(e) a method of manufacturing the first embodiment is disclosed.

Figure 3A:
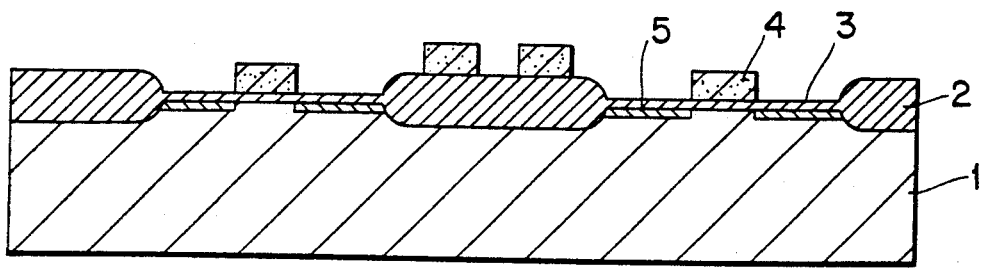
FIGS. 3(a) to 3(f) are cross-sectional views showing process steps in sequence for manufacturing a first embodiment of the present invention.

Firstly, as shown in FIG. 3(a), a field oxide film 2 is formed on a P-type silicon substrate 1 by the ordinary LOCOS method. Following the formation of gate oxide film 3 a polycrystalline silicon layer 4 is deposited by the CVD method and then etched to leave remaining only the portions which become the gate electrodes and wirings. Next an ion implantation of arsenic ions is carried out at an acceleration energy of 100 KeV and a dose of $1.0 \times 10^{16}$ cm$^{-2}$ in a self aligned manner with respect to the gate electrodes, to form source and drain diffusion layers 5.

Figure 3B:
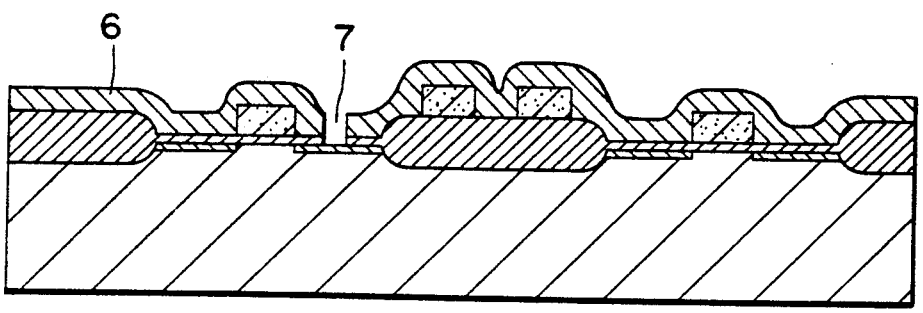

A CVD oxide film 6 is then formed on the entire surface as shown in FIG. 3(b) and an electrode window 7 for forming a capacitor electrode, is opened on the source-drain diffused layer 5.

Figure 3C:
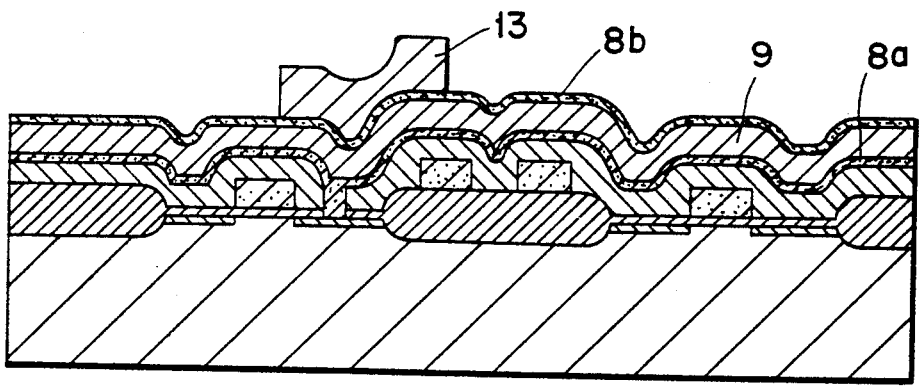

Next, as shown in FIG. 3(c), a polycrystalline silicon layer 8(a) is deposited to a thickness of 800 Å which is followed by the growth of PSG film 9 containing phosphorous to a thickness of 6000 Å. This surface of the PSG film is then smoothed by subjecting it to a heat treatment. Then following the growth of a polycrystalline silicon layer 8b to a thickness of 1500 Å, the portion where the lower electrode of a stacked capacitor is to be formed is covered with a photo-resist pattern 13.

Figure 3D:
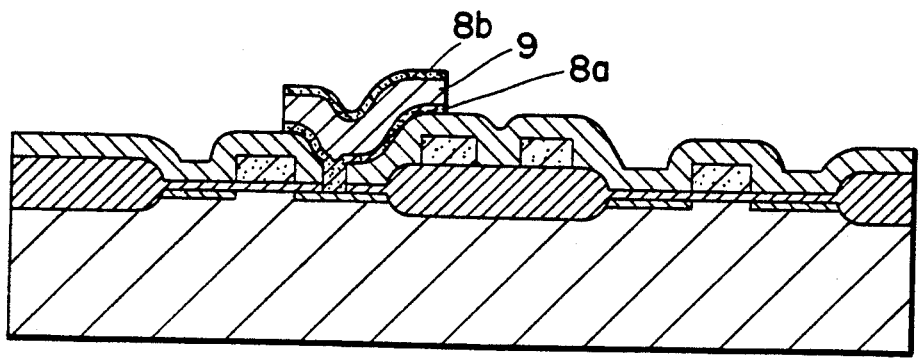

Subsequently, as shown in FIG. 3(d), the polycrystalline silicon layer 8b, the PSG film 9 and the polycrystalline silicon film 8a are removed by etching using the photoresist pattern 13 as a mask. Furthermore, since the polycrystalline silicon layer 8a is a thin film, it is possible to remove the polycrystalline silicon layer from the recessed portions of the chip using a short etching time.

Figure 3E:
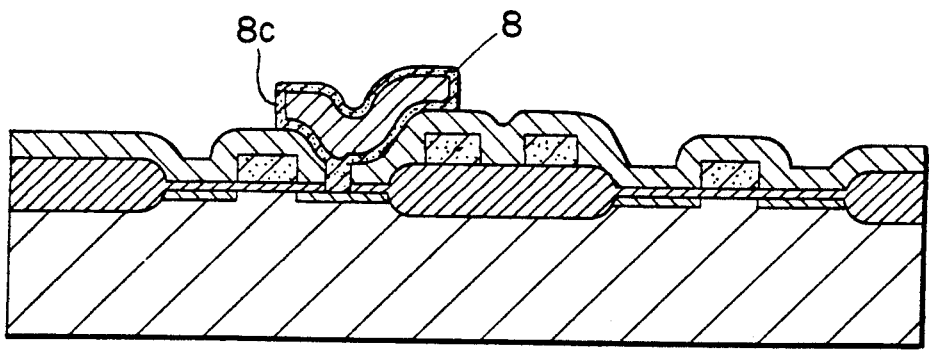

Next with reference to FIG. 3(e), a polycrystalline silicon layer 8c is deposited on the entire surface to a thickness of 2000 Å. Then using an etch back method, the polycrystalline silicon layer 8c is removed leaving it only on the side faces of the PSG film 9. The PSG film 9 is thus enclosed by a polycrystalline silicon layer 8, as shown.

Figure 3F:
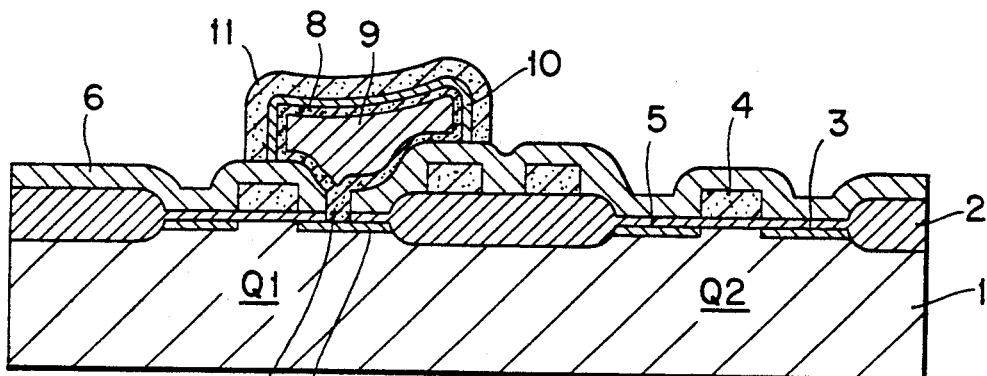

Now, moving on to FIG. 3f, a silicon oxide film 10 is formed as a capacitive insulating film, to a thickness of 100 Å by a thermal oxidation of the polycrystalline silicon. Also, during this time, phosphorous in the PSG film is caused to be diffused into the polycrystalline silicon, thus reducing the resistance of the electrode. Subsequently, a polycrystalline silicon layer 11 is deposited, thereby forming a memory cell having a stacked capacitor, whereby the polycrystalline silicon layer 11 becomes the upper electrode.

Referring to FIGS. 4 and 5(a) to 5(f) the second embodiment of the present invention is shown, wherein, the same components as those shown in the first embodiment are indicated by the same reference numerals.

The second embodiment differs from the first one by the provision of a film, provided on the chip in portions other than the capacitor portion, on the transistor Q2, for example, which is part of the peripheral circuitry and formed simultaneously with the PSG film 9, within the lower electrode of the capacitor, and used as part of an inter-insulating layer. This feature of the present embodiment makes it possible to increase the thickness of the interlayer insulating film at required portions without necessitating an increase in the number of processing steps. Further, it achieves a reduction in the parasitic capacitance and a smoothing of the chip surface.

Figure 5A:
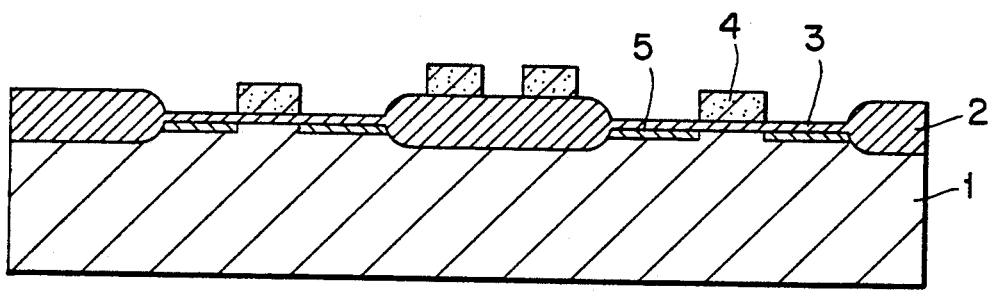
FIGS. 5(a) to 5(f) are cross-sectional views showing process steps in sequence for manufacturing a second embodiment of the present invention.

Next a method a fabricating the device of the present embodiment will be described with reference to FIGS. 5(a) to 5(f), Firstly, as shown in FIG. 5(a), a field oxide film 2 is formed on a P-type silicon substrate 1 by the conventional LOCOS method. Following the formation of gate oxide film 3, a polycrystalline silicon layer 4 is deposited by CVD method and then etched to leave remaining only the portions which become the gate electrodes and wirings. Next an ion implantation of arsenic ions is carried out at an acceleration energy of 100 KeV and a dose of $1.0 \times 10^{16}$ cm$^{-2}$ in a self-aligned manner with respect to the gate electrodes, to form source and drain diffusion layers 5.

Figure 5B:
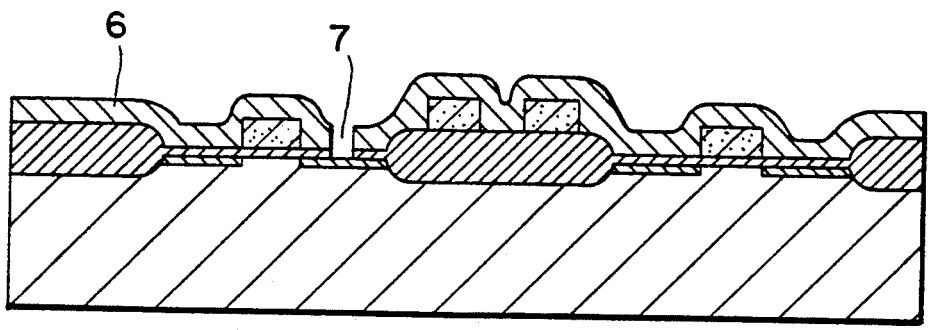

A CVD oxide film 6 is then formed on the entire surface as shown in FIG. 5(b) and an electrode window 7 for forming a capacitor electrode is opened on one of the source and drain diffused layer 5.

Figure 5C:
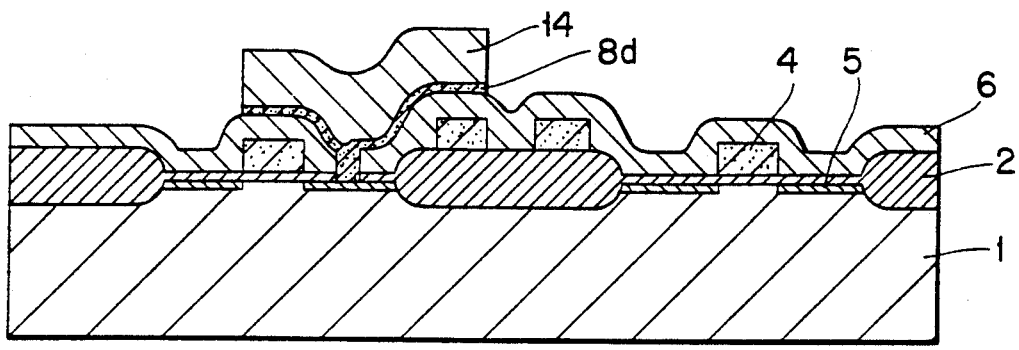
Figure 5D:
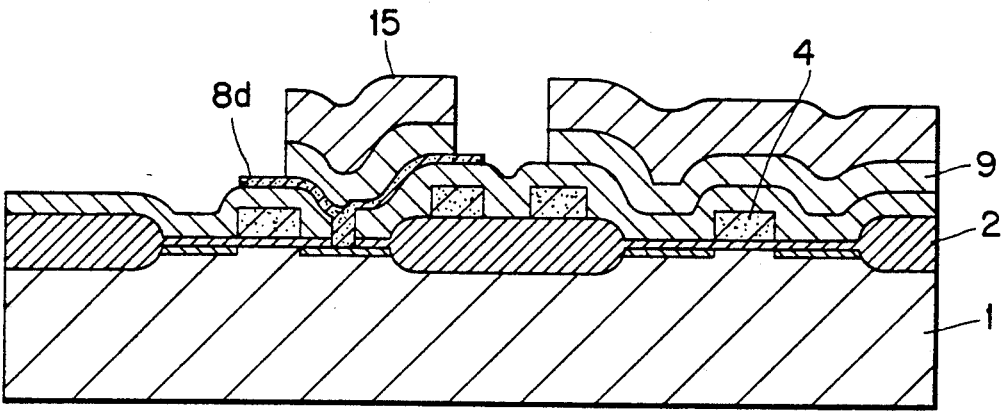

Next, as shown in FIG. 5(c), regions including the portions where a lower electrode of the stacked capacitor is to be formed, are covered with a photoresist 14 and the polycrystalline silicon layer 8d is patterned with the photoresist 14 as the mask.

Then a PSG film 9 is deposited to a thickness of 6000 Å and using a heat treatment, the entire surface is smoothed. Further, a portion of the lower electrode is covered with a photoresist layer 15, and the PSG film 9 is etched using the photoresist 14 as a mask. However, also in this case, portions that require smoothing or portions whose parasitic capacitance is to be reduced, by increasing the thickness of the interlayer insulating film within the portion other than for the lower electrode, are also covered with the photoresist 15, thus allowing the PSG film 9 to remain there.

Figure 5E:
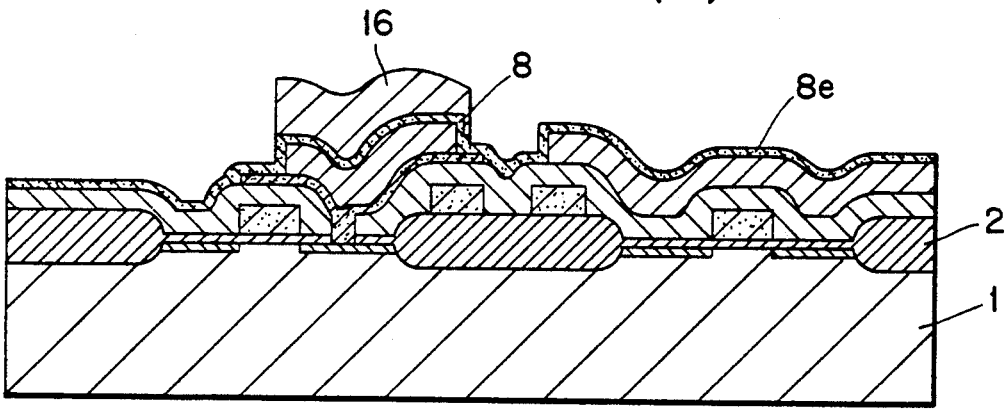

Subsequently, after depositing a polycrystalline silicon layer 8e all over the surface as shown in FIG. 5(e), to a thickness of 2000 Å, the polycrystalline silicon layer 8e is etched using photoresist 16 as the mask so as to enclose the PSG film 9 with a polycrystalline silicon layer 8.

Figure 5F:
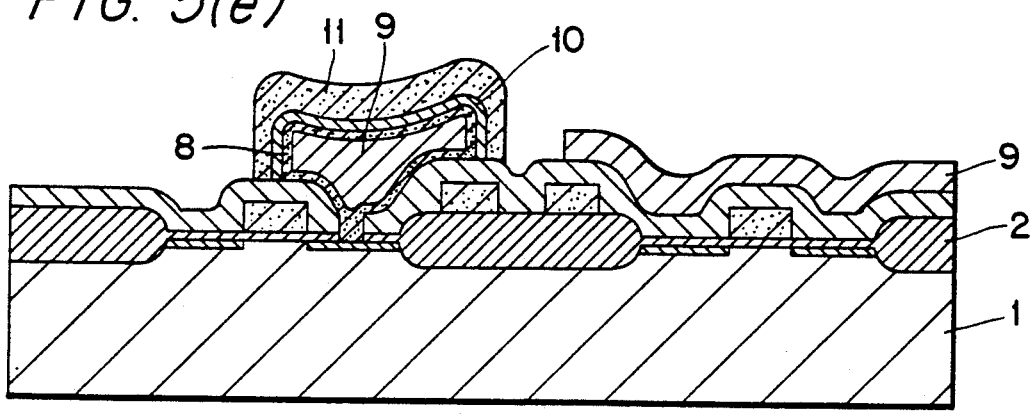

Next, as shown in FIG. 5(f), a silicon oxide film 10 is formed as a capacitive insulating film by thermal oxidation of the polycrystalline silicon to a thickness of 100 Å. At the same time, phosphorous in the PSG film is diffused into the polysilicon layer 8, causing the electrode to have a low resistance. Then, a further polycrystalline silicon layer 11 is deposited, and an upper element is formed by patterning the polycrystalline silicon layer 11, thereby completing the formation of the semiconductor device of the present invention.

Therefore, as has been described above, the lower electrode of the stacked capacitor, which constitutes a memory cell of the present invention, is constructed in such a way as to enclose the insulating film within the electrode. This allows a reduction in the thickness of the electrode material layer of the lower electrode while securing the surface area of the lower electrode.

As a result, the device according to the present invention prevents side etching of the electrode pattern occuring and the roughness or steps in the underlying layers which may be generated during a prolonged etching period.

What is claimed is:

1. A semiconductor memory device having a semiconductor substrate and a plurality of memory cells each including a stacked capacitor having a lower electrode and an oppositely disposed upper electrode, and a MOS transistor electrically connected to said lower electrode, wherein said lower electrode of said stacked capacitor has an island-shaped insulating film formed on said semiconductor substrate and a conductive layer enveloping said insulating film.

2. A semiconductor memory device according to claim 1, wherein said MOS transistor is an insulated gate MOS transistor having a source and a drain, one of said source and drain being electrically connected to said lower electrode of said stacked capacitor.

3. A semiconductor memory device according to claim 1, further comprising an interlayer insulating film provided on portions other than on said capacitor, said interlayer insulating film being formed simultaneously with said insulating film of said lower electrode.

* * * * *